US008610436B2

(12) United States Patent
Besio et al.

(10) Patent No.: US 8,610,436 B2
(45) Date of Patent: Dec. 17, 2013

(54) METHOD FOR MAKING A PERMANENT MAGNET PARTICULARLY FOR MRI SCANNERS AND A PERMANENT MAGNET, PARTICULARLY FOR MRI SCANNERS MADE BY SAID METHOD

(75) Inventors: Stefano Besio, Genoa (IT); Stefano Pittaluga, Genoa (IT); Vincenzo Punzo, S. Giorgio a Cremano (IT); Alessandro Trequattrini, Genoa (IT)

(73) Assignee: Esaote S.p.A., Genoa (IT)

( * ) Notice: Subject to any disclaimer, the term of this patent is extended or adjusted under 35 U.S.C. 154(b) by 468 days.

(21) Appl. No.: 12/899,176

(22) Filed: Oct. 6, 2010

(65) Prior Publication Data
US 2011/0084695 A1    Apr. 14, 2011

(30) Foreign Application Priority Data
Oct. 9, 2009    (IT) .......................... GE2009A000077

(51) Int. Cl.
*G01V 3/00*    (2006.01)
(52) U.S. Cl.
USPC ........................... 324/319; 324/320; 335/302
(58) Field of Classification Search
USPC .......... 324/319, 320, 318, 322; 335/296, 302, 335/306
See application file for complete search history.

(56) References Cited

U.S. PATENT DOCUMENTS 5,337,472 A * 8/1994 Leupold et al. ................ 29/607
5,412,365 A    5/1995 Abele et al.

(Continued)

FOREIGN PATENT DOCUMENTS

| EP | 0 608 179 | 7/1994 |
|---|---|---|
| WO | WO 91/06963 A1 | 5/1991 |
| WO | WO 92/22076 A1 | 12/1992 |
| WO | WO 95/28257 A1 | 10/1995 |

OTHER PUBLICATIONS

Manlio G. Abele, Structures of Permanent Magnets Generation of Uniform Fields, 1993, John Wiley & Sons, Inc., New York, New York.

(Continued)

*Primary Examiner* — Louis Arana
(74) *Attorney, Agent, or Firm* — Buchanan Ingersoll & Rooney PC

(57) ABSTRACT

Method for making magnets particularly for the use in MRI scanners, which magnets are three-dimensional and have a tubular wall made of magnetized material, with a closed or open annular shaped cross-section, the tubular wall being composed of individual elements made of magnetized material, the magnetization of each element made of magnetized material having a predetermined direction in the transverse section plane and said directions being determined such to generate a uniform static magnetic field in the cavity of the tubular wall. The invention provides the following steps: determining the modulus and direction of the magnetization of elements necessary for generating a predetermined magnetic field in said cavity in a theoretical two-dimensional magnet model, extruding the two-dimensional model to a three-dimensional model and at least partially compensating aberrations, distortions or inhomogeneites of the magnetic field generated in the three-dimensional model by modifying the magnetization orientation in the individual elements and in the plane of the two-dimensional model such to minimize differences between the magnetic field in the two-dimensional model and the magnetic field in the three-dimensional model above all as regards its homogeneity level. The invention relates also to a magnet made by said method and particularly a small magnet.

24 Claims, 12 Drawing Sheets

(56) References Cited

U.S. PATENT DOCUMENTS

| | | | |
|---|---|---|---|
| 5,428,333 | A | 6/1995 | Abele et al. |
| 5,621,324 | A * | 4/1997 | Ota et al. ............... 324/319 |
| 5,790,006 | A | 8/1998 | Abele et al. |
| 5,798,680 | A * | 8/1998 | Abele et al. ............. 335/301 |
| 6,225,887 | B1 | 5/2001 | Jensen et al. |
| 6,768,407 | B2 * | 7/2004 | Kohda et al. ............ 335/306 |

OTHER PUBLICATIONS

M.G. Adele et al., "Field Computation in Permanent Magnets," *IEEE Transactions on Magnetics*, Jan. 1992, pp. 931-934, v.28, No. 1.

Manilo G. Adele et al., "Compensation of Field Distortion With Ferromagnetic Materials and Permanent Magnets," *Journal of Applied Physics*, May 15, 1994, pp. 6990-6992, v.75, No. 10, American Institute of Physics.

F. Bertora et al. "Shimming of Yokeless Permanent Magnets Designed to Generate Uniform Fields," *Journal of Applied Physics*, May 15, 1993, pp. 6864-6866, v.73, No. 10, American Institute of Physics.

Manilo G. Adele et al. "Off-Center Magnetic Resonance Imaging With Permanent Magnets," *Journal of Applied Physics*, Apr. 2008, pp. 07E903-1-07E903-3, v.103, No. 7, American Institute of Physics.

Manilo G. Adele, "Three-Dimensional Yokeless Magnets," *IEEE Transactions on Magnetics*, Sep. 1990, pp. 1665-1667, v.26, No. 5.

M. G. Adele et al. "Optimum Design of Yokeless Permanent Magnets," *Journal of Applied Physics*, May 1, 1990, pp. 4644-4646, v.67, No. 9, American Institute of Physics.

Search Report dated Jan. 10, 2011, issued by the European Patent Office in corresponding Italian Patent Application No. GE09A77-ESA-EP.

Italian Search Report issued on Apr. 29, 2010 in IT GE2009000077 (with English language translation of category of cited documents).

Italian Office Action issued on Oct. 9, 2009 in IT GE2009000077.

M.G. Abele et al., "Field Computation in Permanent Magnets", IEEE Transactions on Magnetics, vol. 28, No. 1, Jan. 1992, pp. 931-934, XP-002579943.

Manlio G. Abele et al., "Compensation of Field Distortion With Ferromagnetic Materials and Permanent Magnets", Journal of Applied Physics, vol. 75, No. 10, Pt, 2b, May 15, 1994, pp. 6990-6992, XP-000458523.

F. Bertora et al., "Shimming of Yokeless Permanent Magnets Designed to Generate Uniform Fields", Journal of Applied Physics, vol. 73, No. 10, Pt. IIB, May 15, 1993, pp. 6864-6866, XP-000380618.

Manlio G. Abele, "Three-Dimensional Yokeless Magnets", IEEE Transactions on Magnetics, vol. 26, No. 5, Sep. 1, 1990, pp. 1665-1667, XP-000150440.

M.G. Abele et al., "Optimum Design of Yokeless Permanent Magnets", Journal of Applied Physics, vo. 67, No. 9, May 1, 1990, pp. 4644-4646, XP-002879945.

\* cited by examiner

METHOD FOR MAKING A PERMANENT MAGNET PARTICULARLY FOR MRI SCANNERS AND A PERMANENT MAGNET, PARTICULARLY FOR MRI SCANNERS MADE BY SAID METHOD

Method for making a permanent magnet particularly for MRI scanners and a permanent magnet, particularly for MRI scanners made by said method.

The present invention relates to a method for making a permanent magnet particularly for MRI scanners and a permanent magnet, particularly for MRI scanners made by said method.

In particular the invention relates to a method according to the preamble of claim 15 and a to magnet according to the preamble of claim 1.

Methods for the design and the layout of permanent magnets composed of magnetized elements and having a tubular structure, whose tubular wall is composed of an assembly of adjacent magnetized elements are well known and widely used.

The theoretical design basis of permanent magnets with a tubular structure having a closed or open cross-section are particularly described for example in the publication "Structures of permanent magnets" Abele, M. John Wiley and Sons, New York, 1993.

Other publications describing further and different aspects of the design of permanent magnets for example are: WO9106963A1 regarding the optimal design of two-dimensional magnets; WO9222076A1 describing methods for the optimal design of yoked permanent magnets; WO9528657A1 and EP0608179A1 wherein a method for filtering inhomogeneities and aberrations of the static magnetic field of permanent magnets is described; U.S. Pat. No. 5,412,365A describing a permanent magnet structure for medical applications; U.S. Pat. No. 5,790,006A and U.S. Pat. No. 6,225,887B1 wherein a method for making permanent magnets composed of a plurality of magnetized wedge-shaped elements is described.

In particular WO9106963A1 cites several further combinations of publications describing the theoretical basis for designing and optimizing permanent magnet structures.

Techniques currently used for designing magnets and particularly magnets to be used in the MRI field, provide a two-dimensional theoretical model of the magnet to be generated. Due to the fact that magnets have an annular/tubular structure with an open or closed annular cross-section, the two-dimensional model used is the one corresponding to the cross-section of the magnet that is according to a section plane perpendicular to the central longitudinal axis of the tube-like wall of the magnet.

Dimensions, shapes and the amount of magnetized elements forming the magnet, as well as their relative arrangement as well as for each magnetized element the modulus and the magnetization direction necessary for obtaining a static magnetic field within the magnet cavity having a predetermined direction, a predetermined strength and a predetermined homogeneity are calculated starting from the two-dimensional model.

The two-dimensional model is notoriously very different from the real conditions, in the direction of the longitudinal axis of the tubular/annular wall of the magnet the conditions of the two-dimensional model are the same that would be provided in an annular tubular magnet with infinite dimensions in the direction of the axis of the tubular/annular wall.

The application of the two-dimensional model to a real annular (tubular) magnet and therefore with a predetermined finite extension in the direction of the central axis of the tubular/annular wall causes aberrations and inhomogeneities of the magnetic field to arise due to the open sides at the ends of the tubular/annular wall.

In the following description and claims the mere term tubular will be used for denoting also annular structures. The only difference of these structures from the geometrical point of view is the axial extension of the tube-like wall in relation to the diameter of said tube-like wall.

Therefore, the step for the extrusion of the final three-dimensional shape of the magnet starting from the two-dimensional model to the three-dimensional model and to the real magnet causes the static magnetic field generated from it into the cavity to lose optimization characteristics, above all as regards homogeneity. Aberrations or distortions or inhomogeneities which have been generated are more critical when the magnet is small and above all when the axial extension is small with respect to the diameter, thus the structure resembles more an annular shape than a tubular shape.

Currently the magnet is modified by introducing elements for filtering, suppressing and/or compensating aberrations, distorsions or inhomogeneities.

Operations are usually time-consuming and complex and therefore expensive.

In the publication Abele M. G. et Al. "Field computation in permanent magnets" IEEE Transactions on Magentics, Vol. 28, no. 1 Jan. 1992 pages 931-934, measures are disclosed for compensation aberrations introduced by giving to a bidimensional design of a magnet a three-dimensional finite length along an axis perpendicular to the plane of the bidimensional design of the magnet. The document discloses two different ways of compensation the aberrations introduced by departing from an idea condition such as opening the magnet to allow access to the cavity. The aberration considered here are not relative to the exreusion of an ideal two dimensional model into three dimensional model having finite dimensions, but to start from a design in which the cavity where the staticmagnetic field has to be generated is completely closed. Two separate and different solutions are suggested, which operate in different way. In one case cuts are provided in the magnet. In the second case provides the insertion at the openings of the cavity of high permeability material for straightening the field and for limiting the bulging out of the magnetic field lines. In none of, the above cases the measures disclosed vary the angle of the magnetization vector in the section plane, i.e. in the plane perpendicular to the direction of extrusion in which plane the two dimensional model has been designed. Cuts and shimming plates in the configuration disclosed in the document are clearly measures which enhances the modules of the magnetisation and which do not rotate the direction of magnetisation in the section plane, but if at all in a direction perpendicular to the section plane and thus inn the direction of extrusion of two dimensional design in a finite three dimensional magnet.

The invention is based on the problem of providing a method for making a permanent magnet particularly for MRI scanners allowing a three-dimensional magnet designed from a two-dimensional model thereof to be optimized in a more simple and precise way.

The aim of the invention is also to make a permanent magnet by the above method, particularly for MRI scanners and it has to be cost-saving while optimizing characteristics of the static magnetic field generated therefrom which have to be at least the same or even better than the ones of magnets made according to current techniques.

Particularly the invention relates to the production of small magnets and whose magnetic field is optimized by the method according to the present invention.

The invention achieves the above aims by a method for making magnets particularly to be used in MRI scanners, which magnets are three-dimensional and have a tubular wall made of magnetized material, with a longitudinal axis and with a cross-section with respect to said longitudinal axis, which cross-section has a closed or open annular shape, the tube-like wall being composed of individual elements made of magnetized material having a longitudinal extension parallel to the axis of the tubular shape and they are arranged one after the other;

all the adjacent elements made of magnetized material or all of them except for two subsequent elements of magnetized material being provided one in contact to the other along at least a peripherical surface or a linear edge thereof having a longitudinal extension parallel to the axis of the tubular shape;

the magnetization of each element made of magnetized material having a predetermined direction in the plane perpendicular to the longitudinal axis of the tubular wall and said directions being defined such to generate a uniform static magnetic field having a predetermined direction which passes through the cavity delimited by the tube-like wall, characterized in that it provides the steps of:

a) determining the modulus and direction of the magnetization vector of individual elements made of magnetized material by calculating for each magnetized element the modulus and direction of the magnetization vector necessary for generating a static magnetic field having a predetermined strength and a predetermined direction and which field passes through the cavity delimited by the tube-like wall on the basis of a theoretical two-dimensional model of the magnet which corresponds to a cross-section thereof;

b) calculating changes of the static magnetic field into the tube-like wall without modifying magnetization vectors of individual magnetized elements in the condition, of the two-dimensional model extended to a three-dimensional model obtained by projecting the two-dimensional model, that is the structure of the magnet in the section plane, along an axis perpendicular to the said section plane and coinciding with the longitudinal axis of the tubular wall such that said tubular wall in the direction of said axis has a predetermined extension greater than zero and smaller than infinity;

c) modifying the direction of magnetization vectors of at least some of the magnetized elements in the section plane perpendicular to the longitudinal axis of the tube-like wall such to minimize differences of the characteristics of the static magnetic field determined on the basis of the three-dimensional model with respect to the characteristics obtained on the basis of the two-dimensional model;

d) providing magnetized elements having geometrical shapes corresponding to the ones of the three-dimensional model and having a magnetization with a modulus and direction corresponding to the ones set at step c).

e) assembling the magnet by mounting individual magnetized elements in the relative position provided by the three-dimensional model.

According to an improvement the method provides the magnet tubular structure to be split into two, three or more subsequent slices which are separated according to section planes transverse to the central longitudinal axis of the tube-like wall, steps b) to e) being carried out individually for each magnet slice.

Following known techniques for designing magnets mentioned above in prior art documents, the method provides the magnet tube-like wall to be composed of a combination of magnetized elements having a trapezoidal and/or triangular and/or wedge-shaped cross-section, only the direction of the magnetization vector of the magnetized elements being subjected to angle variation with respect to the direction of the two-dimensional model.

In particular the direction of the magnetization vector of the magnetized elements having a magnetization direction different from the one parallel or antiparallel to the direction of the static magnetic field in the cavity of the tubular wall is subjected to angle variation in the three-dimensional model with respect to the two-dimensional model.

In particular the value of the angle with reference to the direction of the magnetic field within the cavity is modified with respect to the theoretical one of the two-dimensional model.

Angle variations of magnetization directions or of the angle with reference to the direction of the magnetic field into the cavity can be heuristically determined by trial and error processes. However such method would require high calculation time as for each choice of a new magnetization direction or of a new angle with reference to the direction of the magnetic field into the cavity it is necessary to calculate strength, direction and homogeneity parameters of the static magnetic field generated by the magnet.

An improvement of the method combines the random heuristic technique with an evolutionary technique which follows a more rapid approach for finding the optimal solution starting from previous solutions and it consists in using optimization algorithms, such as stochastic algorithms or in particular such as genetic algorithms.

A possible method of using the genetic algorithm consists in the fact that the genetic inheritance of each individual of the population breeding a generation is composed of said variation of the magnetization direction and/or of the angle with reference to the direction of the magnetic field within the cavity. The parameter for qualitatively evaluating individuals which regulates the coupling among individuals, i.e. enabling the genetic characteristics of such individuals to be combined can be for example the homogeneity and/or strength and/or direction parameters of the static magnetic field thereof.

In a specific embodiment such parameters can be composed of the field value at the centre of the cavity and the peak to peak inhomogeneity on an ideal ellipsoid surface inside the cavity of the tube-like wall.

As an alternative or in combination thereto it is possible in the three-dimensional model with the opening, to provide the variation of the angle of the magnetization vector (J) provided in the theoretical two-dimensional model for each magnetized element such to minimize differences of mutual orientations of B vector (magnetic induction) and H vector (magnetic field), inside the magnetized material, between the theoretical 2D model and 3D model.

According to a further improvement of the method, it is possible to provide a further optimization step. Such step consists in determining structural characteristics of ferromagnetic filter means at the ends of the tube-like wall.

In a particular embodiment filter means are composed of one, two or more strips made of ferromagnetic material having a predetermined position and predetermined dimensions.

Even in this case parameters regarding the amount of strips, the position of strips and dimensions of strips are determined by means of optimization algorithms such as for example stochastic algorithms and particularly genetic algorithms. In this latter case, genetic inheritance of each individual is composed of specific values of parameters regarding the amount of strips, the position of strips and dimensions of strips and coupling enabling parameters being composed of theoretical strength and/or homogeneity values of the static magnetic field.

The general concept of the method according to the present invention is based on the fact of surprisingly finding that aberrations, distortions and inhomogeneities produced in the magnet model from the two-dimensional shape or the infinite axial length shape to the three-dimensional shape or the finite axial length shape are considerably compensated by modifying magnetization directions of some magnetized elements consistuting the magnet with respect to the ones provided in the two-dimensional model and said magnetization direction variations are angle movements in the section plane perpendicular to the magnet axial extension which generated aberrations, distortions and inhomogeneities, i.e. the section plane wherein the two-dimensional model is made.

Considering current known techniques for compensating, suppressing or filtering said aberrations, distortions or inhomogeneities they provide always compensating, suppressing or filter elements provided at the open sides of the tubular shape of the magnet and therefore they act substantially in the direction of the central longitudinal axis of the magnet and not in the section plane perpendicular thereto.

It is clear that the connection of aberrations, distortions and inhomogeneities generated by the extension of the magnet structure in the direction of an axis with compensating actions carried out by changing the magnetization in a plane perpendicular to such axis is not absolutely clear for the person skilled in the art.

Further improvements of the method according to the present invention are object of subclaims.

The invention relates also to a permanent magnet with a tubular or annular structure having an open or closed cross-section, which magnet has a tube-like three-dimensional wall, with a longitudinal axis and with a cross-section with respect to said longitudinal axis which cross-section has a closed or open annular shape, the tube-like wall being composed of individual elements made of magnetized material having a longitudinal extension parallel to the axis of the tubular shape and arranged one after the other all adjacent elements made of magnetized material or all of them except for two subsequent elements made of magnetized material being provided one in contact with the other at least along a peripherical surface or a linear edge thereof having a longitudinal extension parallel to the axis of the tubular shape.

The magnetization of each element made of magnetized material has a predetermined direction in the plane perpendicular to the longitudinal axis of the tubular wall and said directions are determined such to generate a uniform static magnetic field having a predetermined strength and a predetermined direction which field passes through the cavity delimited by the tube-like wall.

By the method according to the invention, the magnetization direction of at least some elements is rotated in said plane perpendicular to the axis of the wall with respect to the theoretical magnetization direction calculated on the basis of a two-dimensional magnet model corresponding to a cross-section of the tube-like wall of the magnet, while the remaining magnetized elements keep the magnetization direction calculated on the basis of said model and the angle variation being such that differences of strength, direction and homogeneity parameters of the static magnetic field generated by the magnet and strength, direction and homogeneity parameters of the ideal static magnetic field according to the two-dimensional model are minimized.

It is possible to provide different magnet structures made by known prior art techniques to which reference has already been made above.

A particular magnet structure provides at least two first magnetized elements arranged in a position diametrically opposite with respect to the axis of the tubular wall and whose magnetization has the same modulus and concordant direction moreover the magnetization direction being parallel to the direction of the static magnetic field passing through the cavity of the tube-like wall, while for the connection of said two first magnetized elements it has magnetized elements having a magnetization whose direction is not parallel to the direction of the static magnetic field into the cavity of the tubular wall, the magnetization direction of only the latter further magnetized elements being modified with respect to the theoretical magnetization direction calculated on the basis of a two-dimensional magnet model corresponding to a cross-section of the magnet tube-like wall.

According to an improvement the two first diametrically opposite magnetized elements have an isosceles trapezium shape, and have the same shape and dimensions, they being arranged with the shortest base side faced towards the shortest base side of the other first magnetized trapezoidal element and with the longest base side faced towards the outside.

In the above case the inclined sides of the two trapezoidal cross-section magnetized elements, which inclined sides are provided at the same side of the central longitudinal axis of said trapezoidal magnetized elements, are connected one to the other by two triangular or irregular trapezium shaped magnetized elements having a side adhering against the corresponding inclined side of one of the two trapezoidal magnetized elements and are in contact one with the other at a vertice.

According to a further characteristic the two triangular or irregular trapezium shaped elements connecting at opposite sides of the central axis of the tube-like wall the inclined sides of the two trapezoidal magnetized elements are symmetric one to the other with respect to a plane parallel to the shortest base surfaces of said two trapezoidal magnetized elements and passing through the central axis of the tube-like wall.

Magnetizations of each pair of triangular or irregular trapezium shaped magnetized elements have magnetization directions inclined symmetrically with respect to said plane parallel to the shortest base surfaces of said two trapezoidal magnetized elements and passing through the central axis of the tube-like wall and have an opposite sense, each one of said magnetization vectors having at least a component parallel to the static field in the cavity.

The particular structure mentioned above suits a yoked magnet which yoke externally covers like a casing the whole outer peripherical shell surface of the tubular wall forming the magnet.

A variant of the particular structure which can be achieved by the method according to the present invention is characterized in that the tube-like wall is composed of a combination of triangular elements, first isosceles triangular magnetized elements being provided with their bases faced towards the inner cavity of the tube-like wall and forming the shell inner wall thereof of which at least two pairs of triangular elements are diametrically opposite each other with respect to the central axis of the tube-like wall, while bases of said at least two triangular magnetized elements are parallel each other and said first triangular magnetized elements being in contact each other at vertices of the base side, at least two of said first magnetized elements are provided with their base side perpendicular to the direction of the static magnetic field in the cavity and have a magnetization with the same modulus and with concordant direction and a direction concordant to the one of the static magnetic field in the cavity, while at least the further pair of first triangular magnetized elements extends by their base side parallel to the direction of the static magnetic field in the cavity and their magnetization has the same modulus and a direction opposite to the one of the static magnetic field in the cavity.

In combination with said first magnetized elements the structure provides second triangular magnetized elements each one externally overlapping an inclined side of one of the first triangular magnetized elements and they being mutually in contact each other respectively with a previous second magnetized element by the corresponding inclined sides oriented according to the bisector of the angle formed at the vertice where two first triangular magnetized elements contact each other and, their vertice opposite to said inclined side contacting said previous second magnetized element being in contact with the vertice of a subsequent second magnetized element the assembly of said triangles being symmetric with respect to two central planes parallel to base sides of the two pairs of first triangular magnetized elements respectively.

Magnetizations of the second triangular magnetized elements have directions inclined with respect to the direction of the static magnetic field, only the magnetization directions of said second triangular elements being subjected to angle variation with respect to theoretical directions determined on the basis of the two-dimensional magnet model.

This type of structure is particularly fit for yokeless magnets.

A variant embodiment of the magnet provides the tube-like wall to be split into at least two halves or into several slices according to a median transverse plane or more transverse section planes and angle variations of magnetization directions of the second magnetized elements for minimizing the difference of strength, direction and homogeneity parameters of the static magnetic field generated by the magnet and strength, direction and homogeneity parameters of the ideal static magnetic field according to the two-dimensional model being determined individually for each of the two magnet halves or of the several magnet slices.

According to a further improvement at end of the tubular wall, at least some of the magnetized elements and preferably said first magnetized elements and at least said first magnetized elements oriented with their cavity interfacing surface perpendicular to the direction of the static magnetic field in said cavity, have elements for filtering distortions of the static magnetic field overlapped to the end band of said cavity interfacing side.

According to a particular embodiment said filter elements are composed of one, two or more strips made of ferromagnetic material.

Furthermore the term section plane does not only mean a real cutting plane of the device, but also an ideal geometrical antiuty which serves for defining boundaries of regions or portions of the magnet which do not need necessarily be physically separated from other portions of the magnet but which also can be physically separated. The same meaning has the term slices.

These and other characteristics and advantages of the method and of the magnet according to the present invention will be more clear from the following description of some embodiments shown in annexed drawings, wherein.

Figure 4:
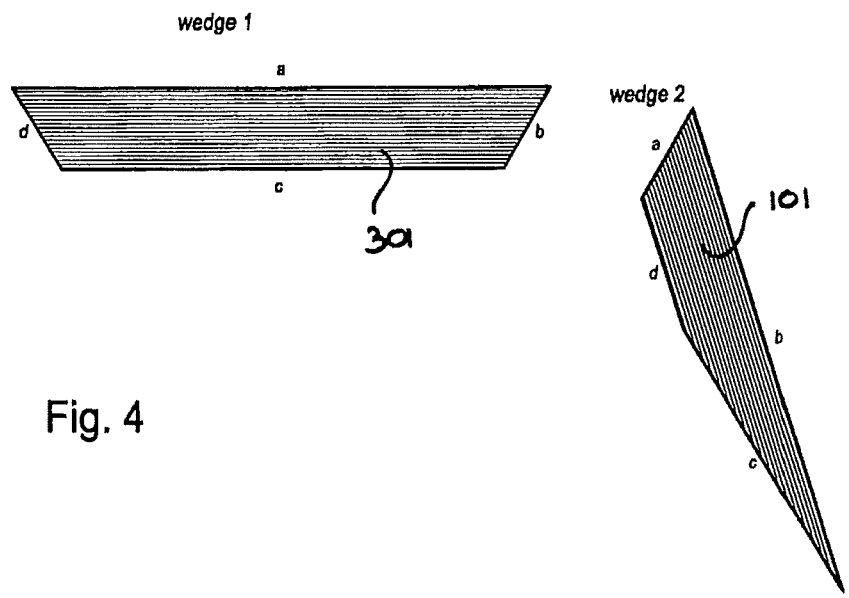
FIG. 4 is the two magnetized elements from which combination the magnet structure according to previous figures is obtained showing their change due to the introduction of poles with respect to the shape in FIGS. 1 and 2.
Figure 5:
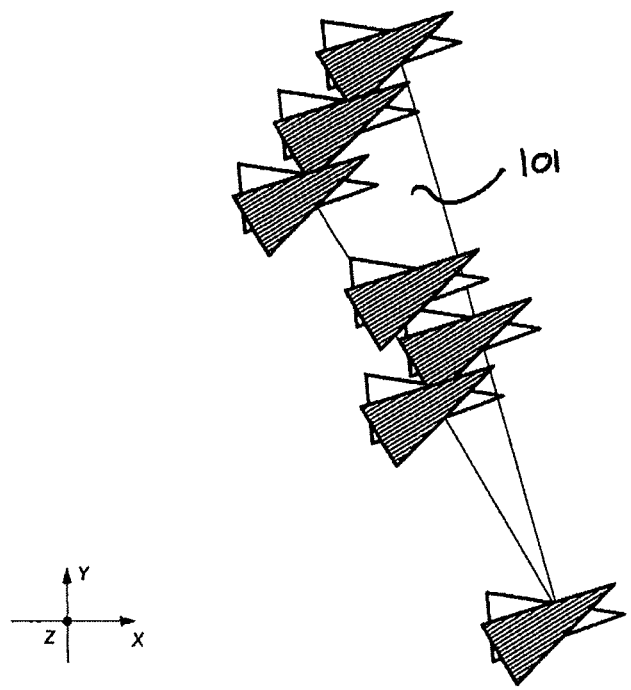

FIG. 5 is the variation of the orientation of the magnetization vector in the wedge-shaped element according to FIG. 4 with respect to the two-dimensional model by using arrows of different shades of grey after the optimization according to the method of the present invention of the three-dimensional structure obtained by the extrusion of the two-dimensional structure in the direction of the central axis.

Figure 6:
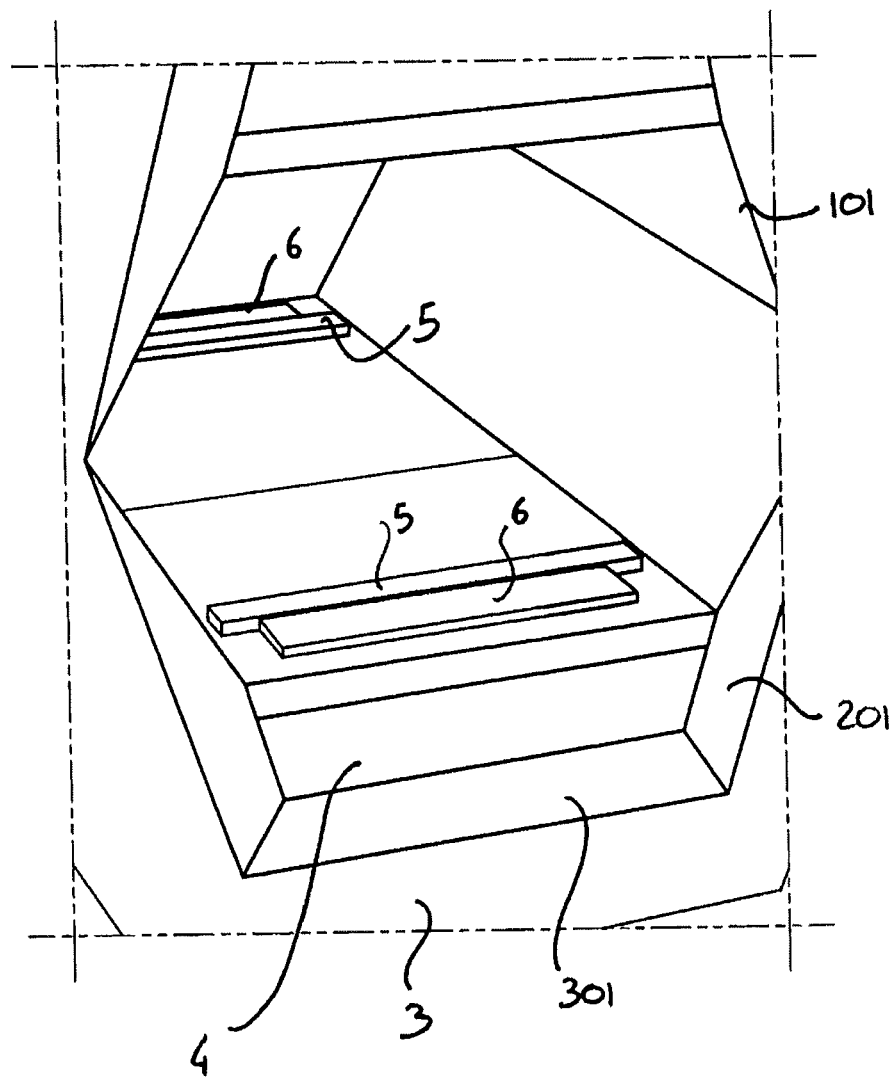

FIG. 6 is the magnet structure according to the previous figures and filters for suppressing or compensating distortions, aberrations and inhomogeneities of the static magnetic field into the magnet cavity and which can be provided in the further optimization step according to the present invention.

Figure 7:
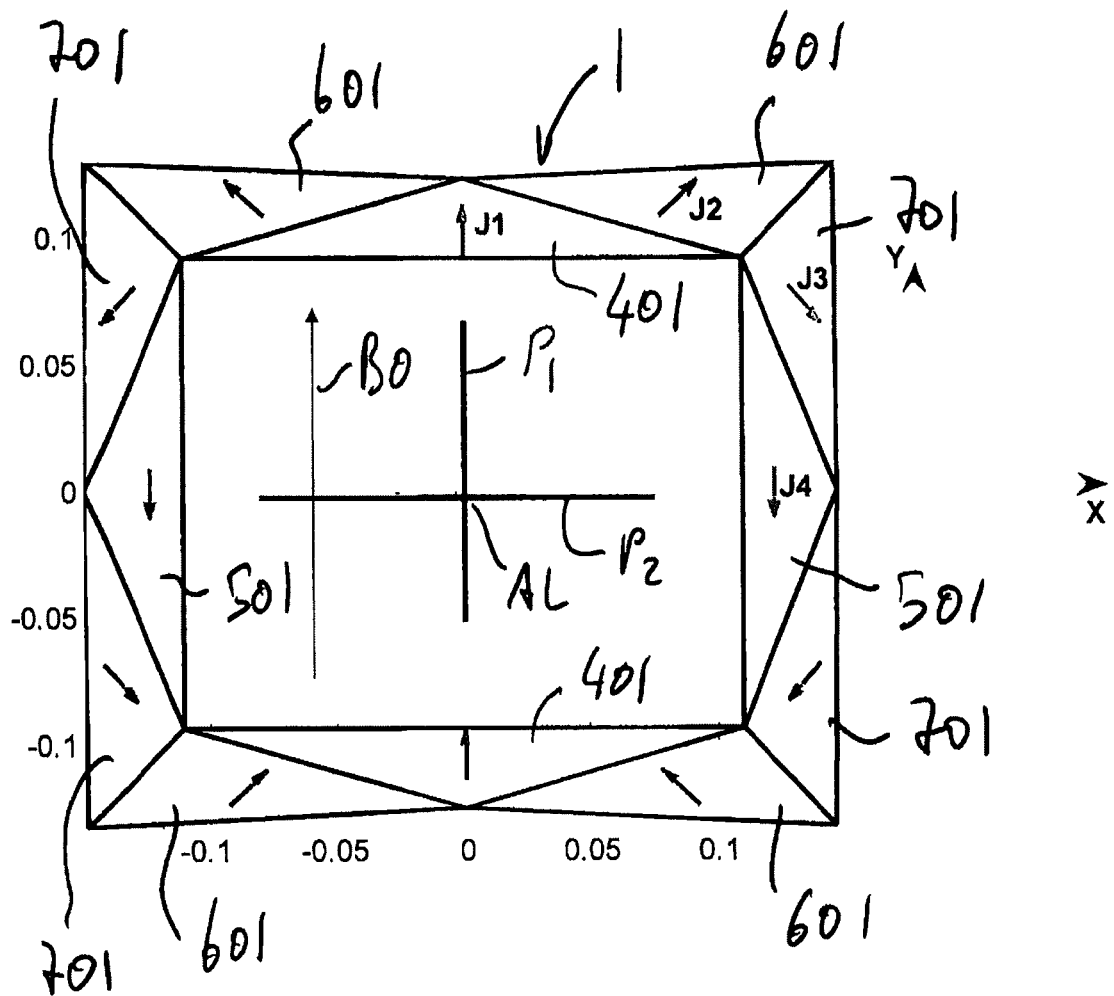

FIG. 7 is a two-dimensional structure of a yokeless magnet.

Figure 8:
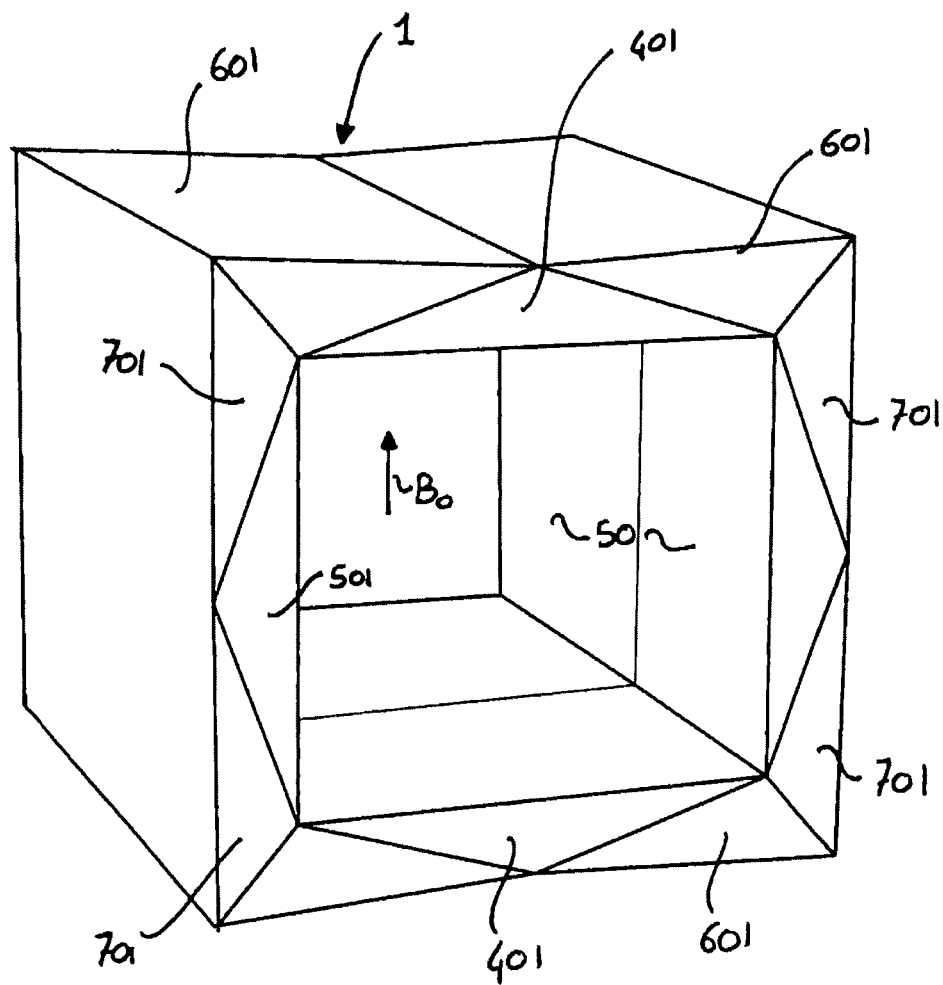

FIG. 8 is a perspective view of the magnet of FIG. 7.

Figure 9:
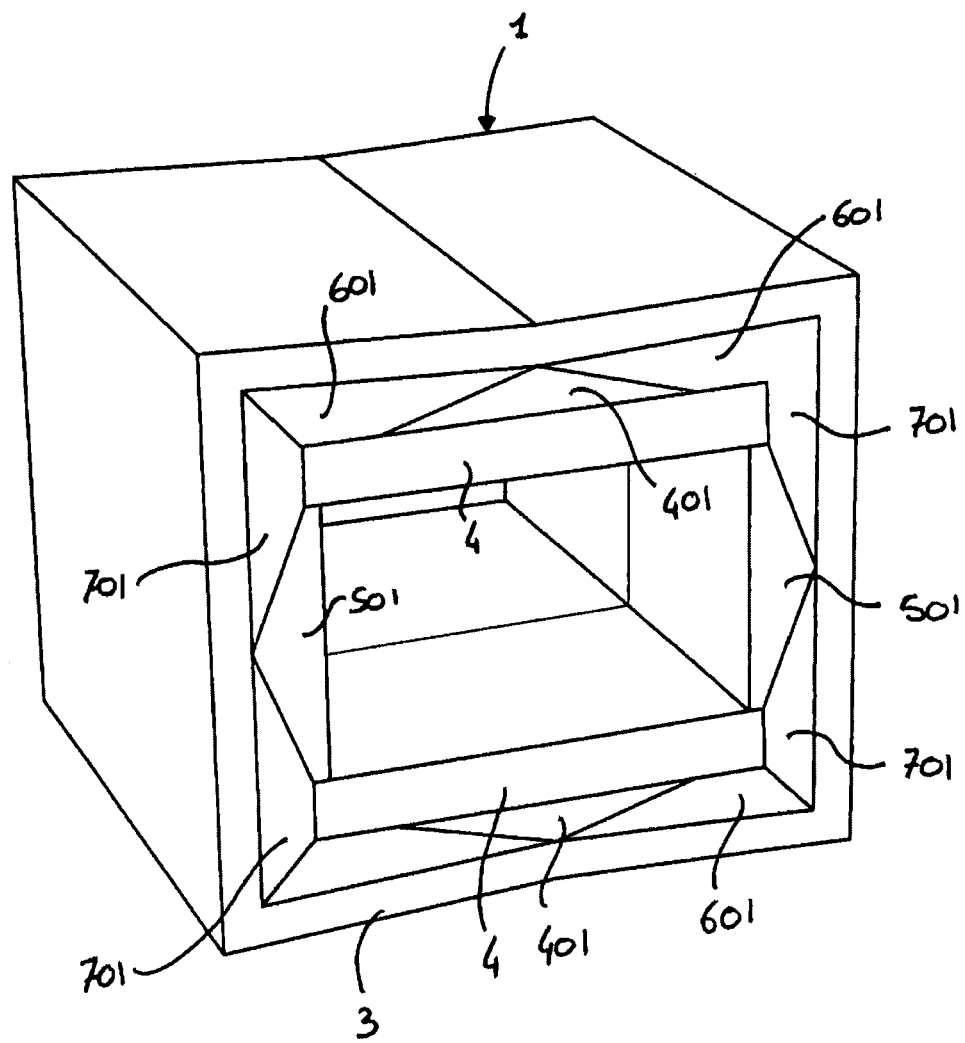

FIG. 9 is a perspective view like FIG. 8, steel pole pieces and a yoke being associated to the magnet.

Figure 10:
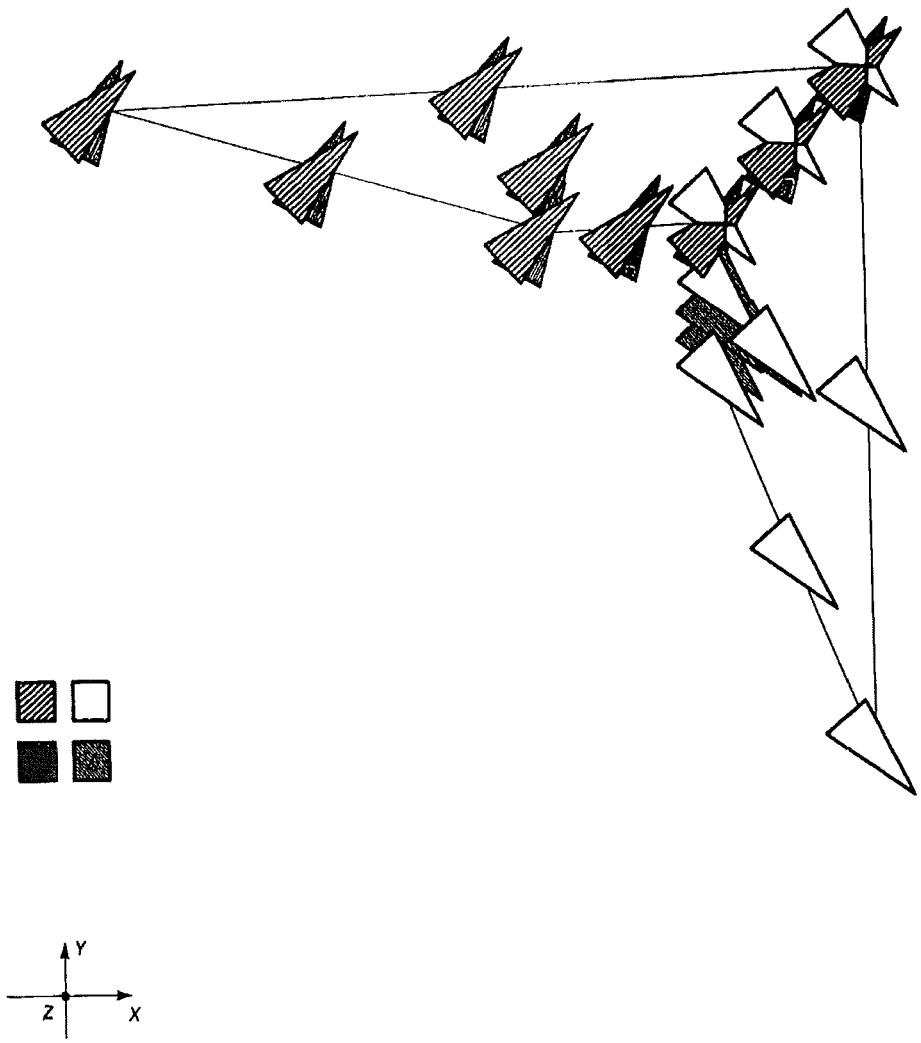

FIG. 10 similarly to FIG. 5 is the variation of the magnetization orientation with respect to the two-dimensional model after the optimization according to the method of the present invention of the three-dimensional structure obtained by the extrusion of the two-dimensional structure in the direction of the central axis.

Figure 11:
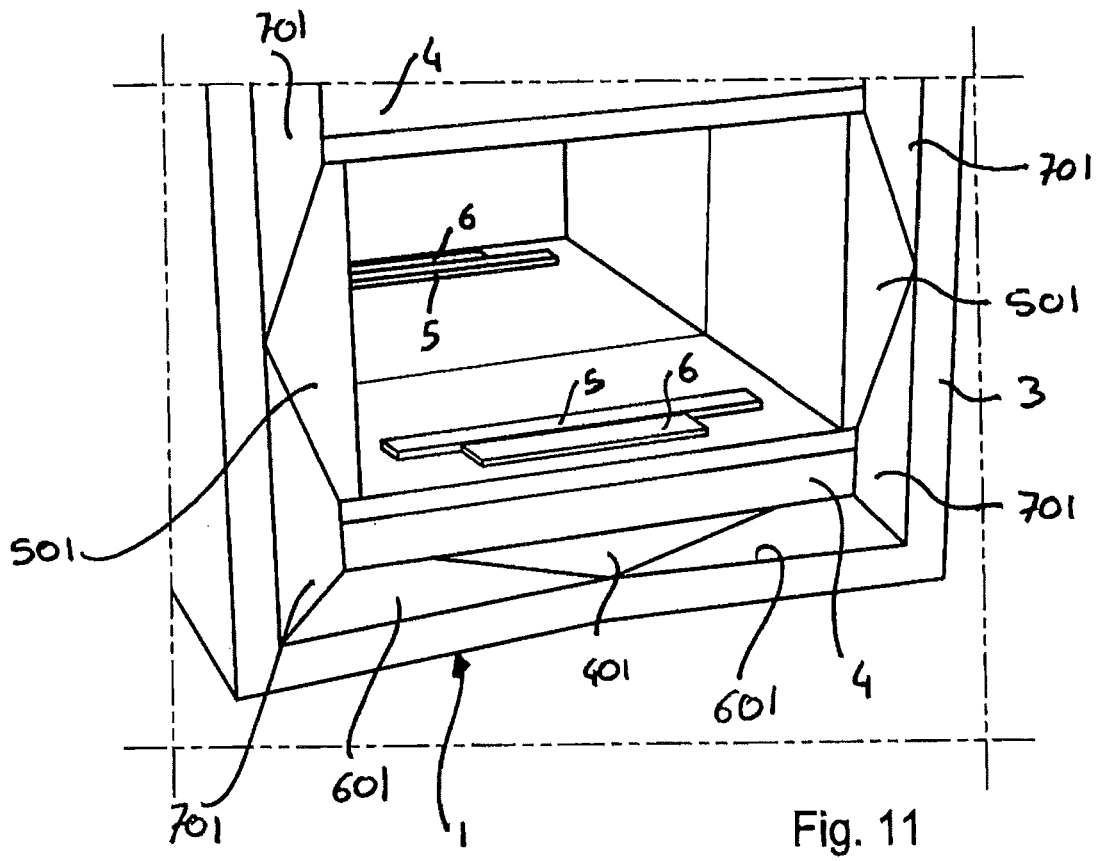

FIG. 11 is the magnet according to FIG. 9 to which filters for suppressing or compensating distortions, aberrations and inhomogeneities of the static magnetic field into the magnet cavity have been associated and which can be provided in the further greater optimization step according to the present invention.

Figure 12:
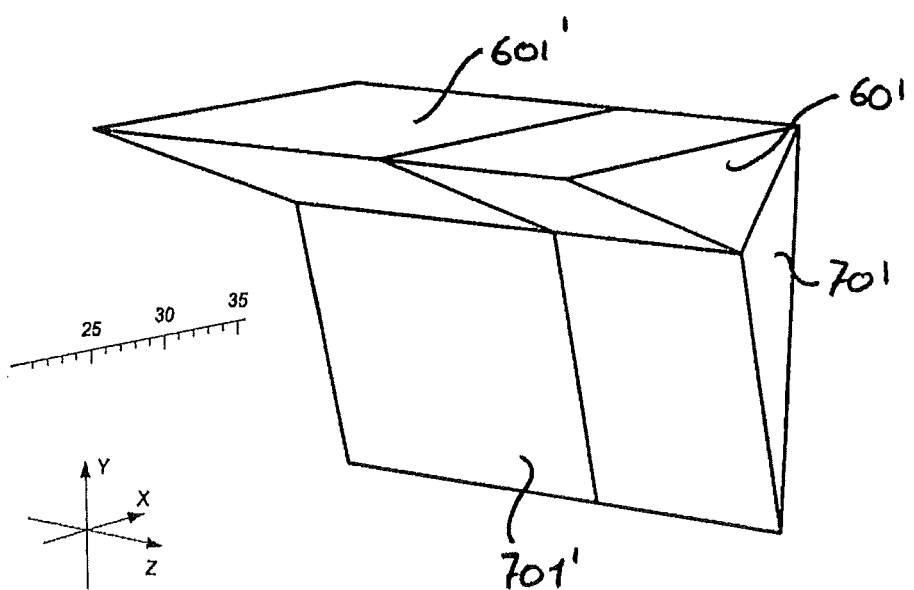

FIG. 12 is a variant embodiment of the method according to the present invention and of the corresponding magnet structure obtained by said method in particular with reference to triangular cross-section or wedge-shaped elements forming said structure and in which variant, said wedge-shaped elements are split at least in two halves according to a section plane coinciding with the transverse section plane perpendicular to, the axis of the magnet annular or tubular wall.

Figure 13:
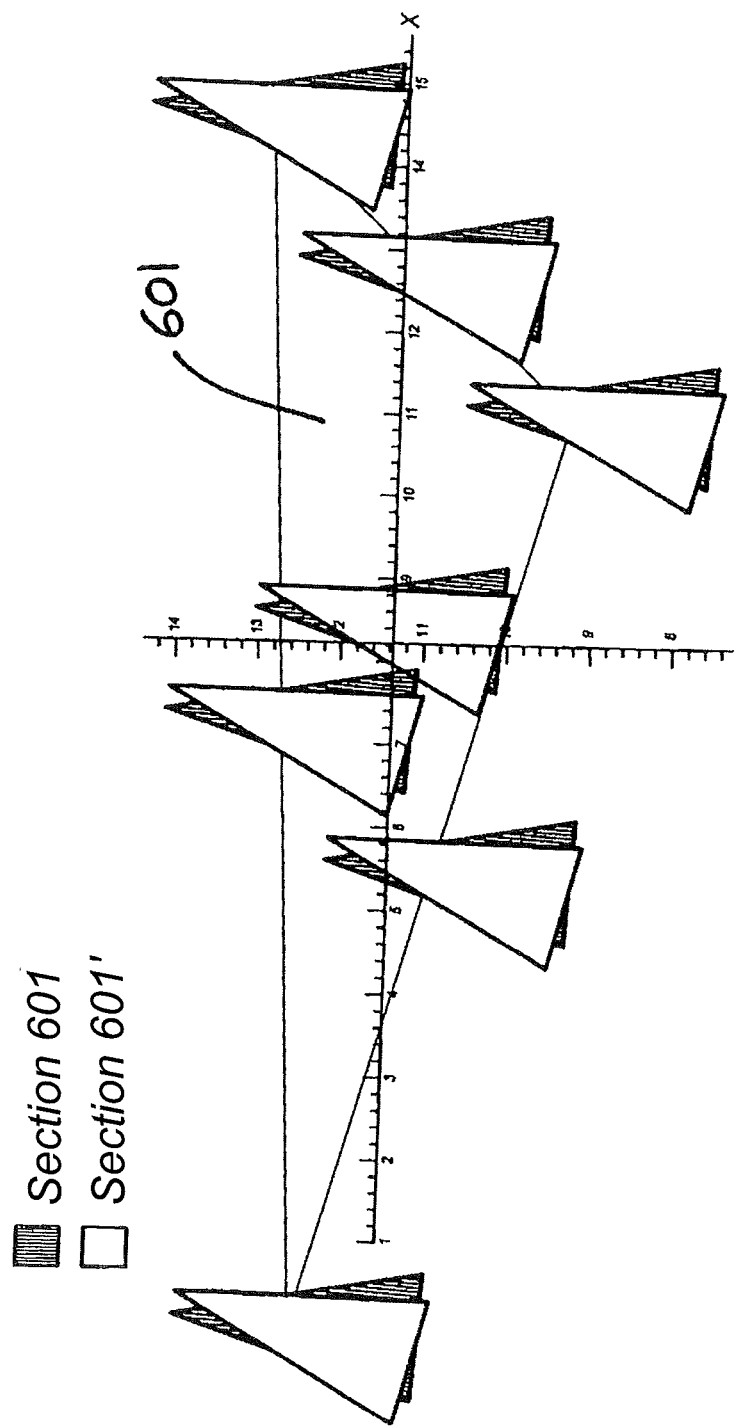
Figure 14:
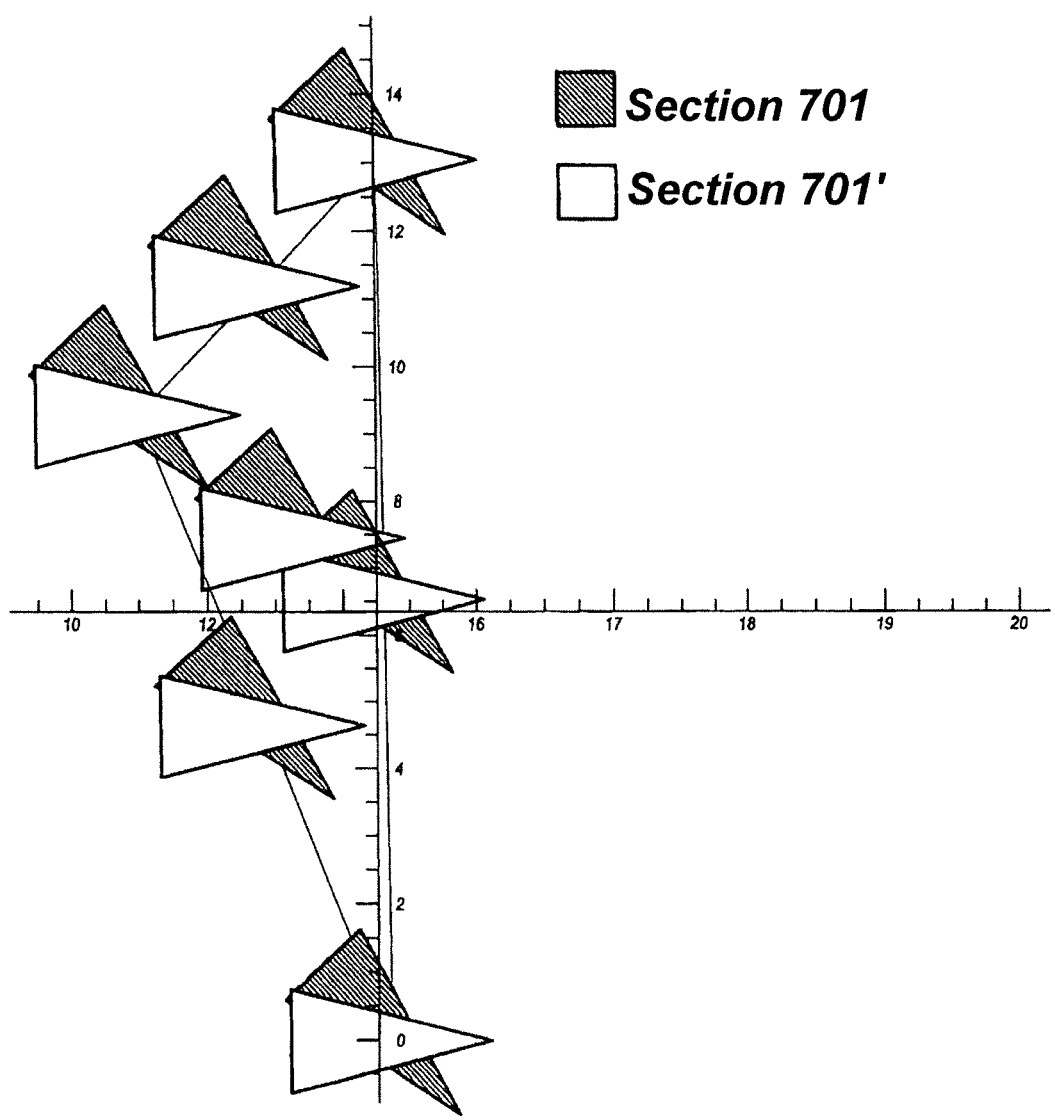

FIGS. 13 and 14 are the differences in the magnetization orientation in the two halves of one of the two types of wedge-shaped elements provided in the magnet structure after the optimization according to the present invention.

Figure 1:
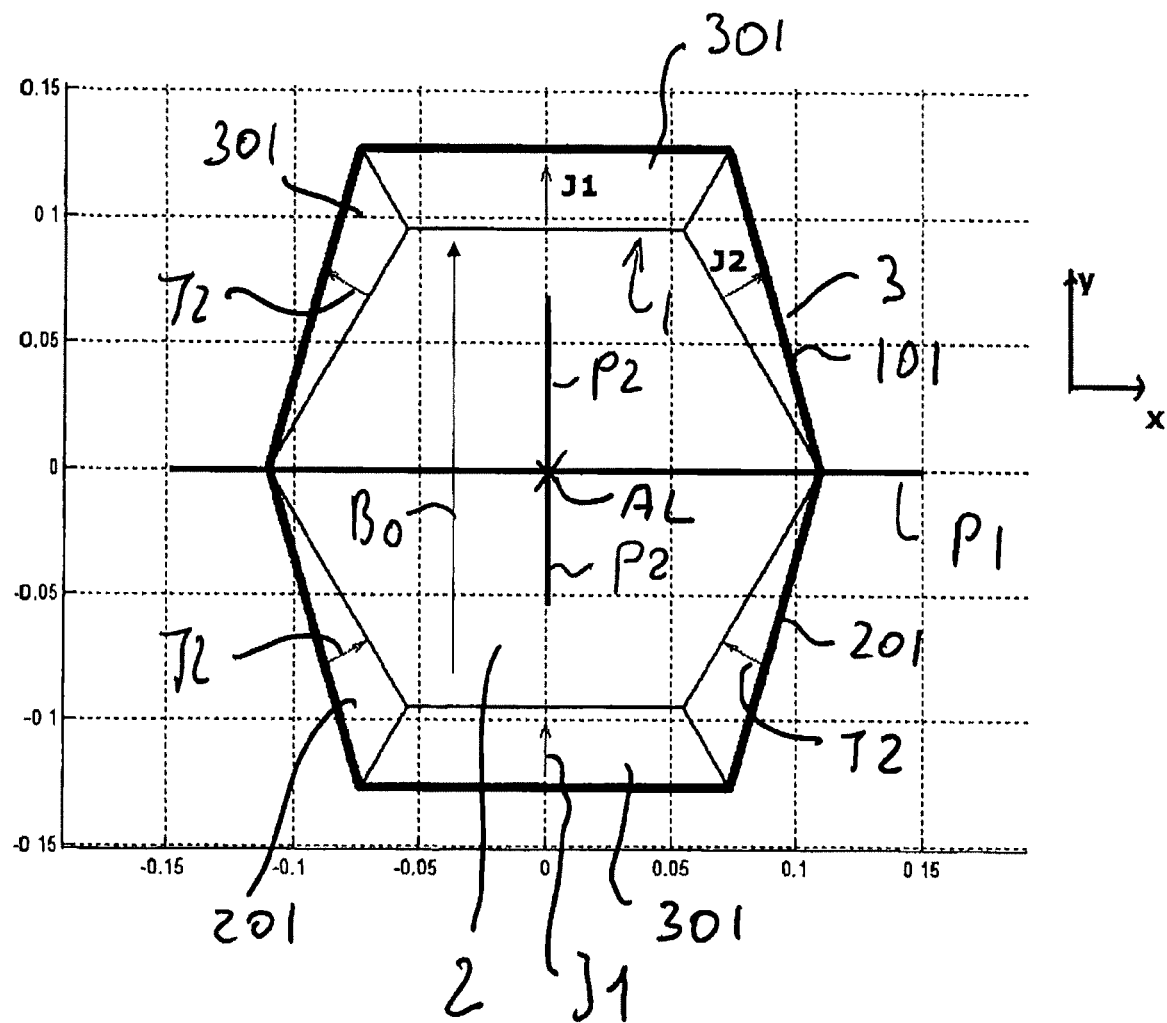
FIG. 1 is a magnet structure of the yoked type according to the present invention.

With reference to FIG. 1, it shows a typical two-dimensional model for designing a tubular or annular magnet having a closed or continuous cross-section. The magnet wall 1 in the two-dimensional model consists of a cross-section of a three-dimensional magnet having a tubular or annular wall. The cross-section is along a plane perpendicular to the central longitudinal axis of the tubular or annular wall.

The three-dimensional shape of the magnet and namely the three-dimensional model as well as the real magnet are obtained by the extrusion of the two-dimensional model in the direction of the longitudinal axis that is z-axis in FIG. 1 and within the traditional nomenclature of axes in the MRI field and it is perpendicular to the sheet.

With reference to the specific embodiment, the magnet has an hexagonal shape and the magnet tubular wall is composed of a sequence of individual trapezoidal or triangular cross-section elements, which are arranged one after the other one with two subsequent elements mutually contacting each other at contact sides or contact vertices thereof such to form together individual longitudinal sections of the magnet tubular wall.

Such method of making the magnet is well known and it is widely used such as described in details in prior art documents mentioned above.

Once desired constructional parameters are determined, and particularly dimensions of the magnet and of the inner cavity delimited by the tubular wall, as well as strength, direction and homogeneity parameters of the static magnetic field B0 to be generated by the magnet into the cavity 2 delimited by said wall 1 and characteristics of the material forming the elements 101, 201, 301 which form together the tubular wall 1 and which have to be magnetized for being the elements made of permanently magnetized material that together generate the static magnetic field B0 into the cavity, by means of known mathematical models it is possible to determine constructional parameters and characteristics of the magnet. Particularly, it is possible to determine magnetization modulus and direction of individual elements 101, 201, 301 that will form elements made of permanently magnetized material in the magnet and the specific shape and final dimensions at least of the section of said permanently magnetized elements in the two-dimensional model.

With reference to the shown embodiment, the two-dimensional model is composed of two isosceles trapezoidal elements 301 which are symmetric with respect to a plane parallel to the longest and shortest bases thereof and passing through the centre of the magnet tubular wall 1, in this case of the cross-section of the magnet tubular wall 1, and therefore containing the central longitudinal axis of said tubular wall 1.

The two trapezoidal elements 301 are arranged with their shortest bases towards the centre of the cross-section of the tubular wall 1 and with the longest bases towards the outside.

At each side of a central axis that is perpendicular to the longest and shortest bases of said isosceles trapezoidal elements and passing also through the centre of the cross-section of the tubular wall 1, the two trapezoidal elements 301 are connected each other by a pair of triangular elements 101 and 201. Each one of such triangular elements adheres to or has an inclined side in common with the inclined side of one of the trapezoidal elements 301, while the two triangular elements 201, 301 on the same side of said central axis perpendicular to the bases of the trapezoidal elements have a vertice in common in a position opposite to the side in contact with the corresponding trapezoidal element.

Preferably, but not necessarily, the two triangular elements are symmetric with respect to the central plane P1 parallel to the bases of the two trapezoidal elements and are also symmetric to each other with respect to said plane.

Preferably the whole structure is symmetric both with respect to the central axis P1 parallel to the bases of the trapezoidal elements and with respect to the central axis P2 perpendicular to the bases of said trapezoidal elements and the central longitudinal axis AL of the tubular wall 1 passes through the point where they intersect each other.

The structure composed of said trapezoidal and triangular elements is externally covered by a yoke element 3 that is continuous for the whole outer perimeter and in the three-dimensional model it forms an outer casing covering the outer shell surface of the magnet tubular wall 1.

By applying known calculation techniques, for each one of the elements 101, 201, 301 forming the cross-section of the tubular wall 1 the exact dimension and the magnetization direction and modulus are determined.

With reference to FIG. 1, this is denoted by vectors J1 and J2. It has to be noted that the two trapezoidal elements 301 have the same and concordant magnetization and which is oriented parallely to and is concordant to the direction of the static magnetic field B0 into the cavity 2.

Each of the triangular elements 101, 201 has a magnetization vector J2 with a direction inclined with respect to the one of the vector J1 and of the static magnetic field B0 the inclination angle of said vectors J2 with respect to the direction of the static magnetic field B0 and of the magnetization vector J1 is symmetric by rotation for each of the triangular elements one with respect to the other, while the sense is such that each vector J2 has at least a component parallel to the static magnetic field B0 or to the magnetization vector J1 and with the sense concordant with the static magnetic field B0 or with the magnetization vector J1.

Starting from such two-dimensional structure model, a three-dimensional model is generated by the extrusion in the direction of the central longitudinal axis of the tube-like wall 1.

The three-dimensional model has a finite extension in the direction of the central longitudinal axis of the tubular wall 1 the two-dimensional model being a cross-section thereof taken along a plane perpendicular to said central longitudinal axis AL.

Figure 2:
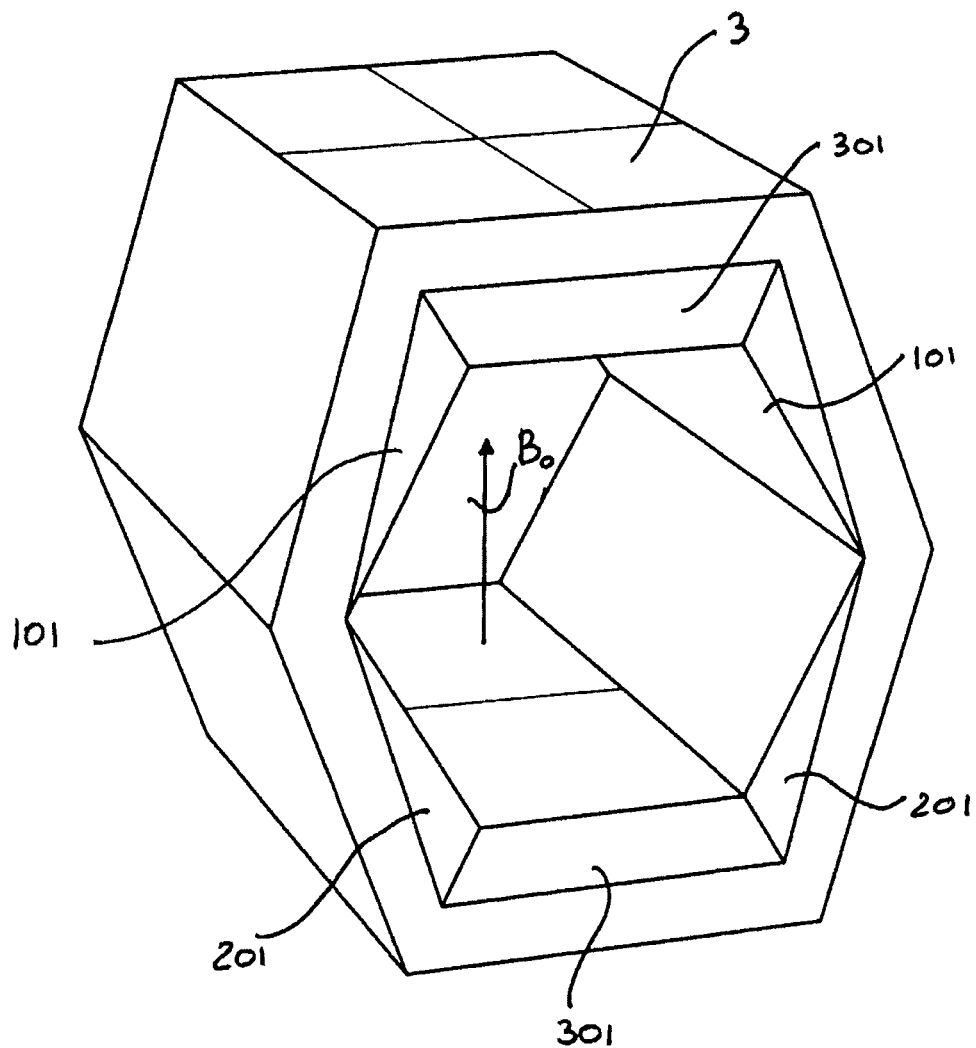
FIGS. 2 and 3 are a perspective view of the structure according to FIG. 1 with and without ferromagnetic plates on magnetic poles respectively.

FIG. 2 graphically shows the appearance of the three-dimensional magnet model.

In this case, the two-dimensional trapezoidal elements are trapezoid-based prisms, while triangular elements are triangle-based prisms and particularly wedges. In order to underline the connection among two-dimensional elements and three-dimensional elements in figures three-dimensional elements have the same reference numbers of the corresponding two-dimensional elements.

Figure 3:
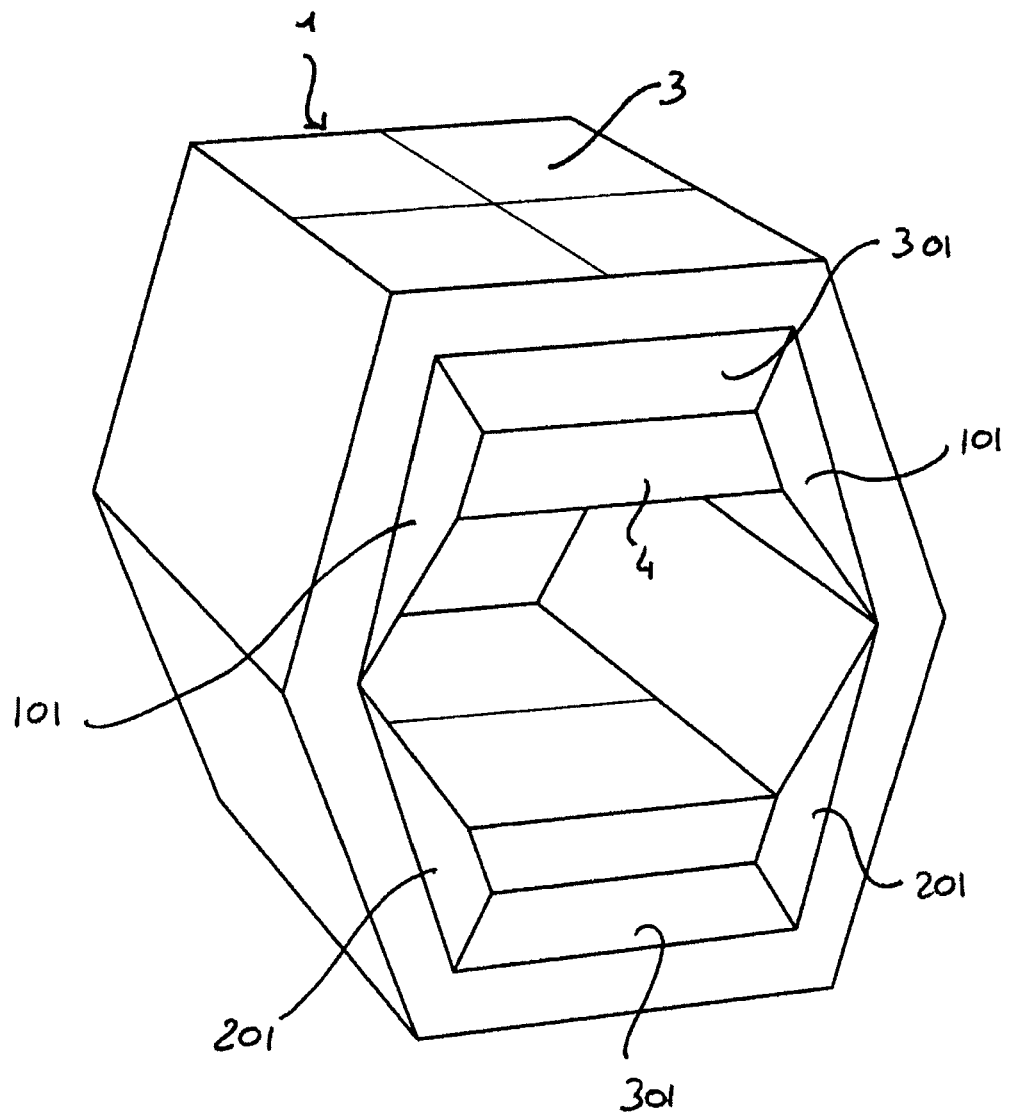

FIG. 3 shows a further variant wherein a pole 4 composed of a layer made of ferromagnetic material particularly steel is provided on the shortest base of the trapezoidal elements delimiting the cavity 3.

Such as in the case of the arrangement of FIGS. 1 and 2, wherein the magnet is without poles both in the arrangement of the two-dimensional model and of the three-dimensional model also in FIG. 3, parameters of constructional elements of the magnet with poles 4 are set by means of the two-dimensional model which will be provided with elements of FIG. 1 and also with a further trapezoidal element overlapping the shortest base of each trapezoidal element 301 whose shape and size correspond to the cross-section of the magnet poles of the three-dimensional model. Characteristics of elements forming the magnet are determined also in this case by the two-dimensional model which is then subjected to extrusion to the three-dimensional model of FIG. 3. In FIG. 3, the two-dimensional model can be directly obtained by the cross-section of the magnet along a plane perpendicular to the central longitudinal axis of the tubular wall 1.

During extrusion, as known, the fact of transforming the two-dimensional model corresponding to an infinite magnet and therefore without open sides which are on the contrary provided in the finite length three-dimensional model, leads to distortions, aberrations and inhomogeneities of the static magnetic field B0 into the cavity 2. FIG. 4 shows constituents 301 and 101 of the model of FIG. 3. Triangular elements have been modified into trapezoidal elements by the introduction of poles 4 having a trapezoidal section, therefore a portion of the triangular elements 101, 201 has been smoothed resulting in an irregular trapezoid section shape.

The following table shows geometrical dimensions of the two characteristic wedges of the structure and shown in FIG. 4:

| | wedge | |
|---|---|---|
| side | 301 | 101/201 |
| a (cm) | 14.66 | 2.68 |
| b (cm) | 2.68 | 11.08 |
| c (cm) | 12.00 | 8.06 |
| d (cm) | 2.68 | 5.70 |

The following table shows the maximum value of the modulus of the H-field (demagnetizing field) inside each individual magnetized element (wedge) 101, 201, 301:

| wedge | Field (Oersted) |
|---|---|
| 301 | 12000 |
| 101/201 | 13700 |

Therefore, even in this case, the magnetized material grade to be considered must have a remanence value $J_r$ around 1.37 T, and also a coercive force not below 14 KOe.

Instead of providing additional compensating structures as suggested by current techniques, the invention provides to act on magnetizations of magnetized elements and particularly on the magnetization orientation angle of triangular elements, that is wedge-shaped elements 101, 201. Such changes are generated only in the section plane of the two-dimensional model and therefore they do not cause magnetization components to be generated in the direction of the z-axis and that is of the longitudinal axis of the tubular wall 1 corresponding also to the extrusion direction of the two-dimensional model to the three-dimensional model.

This action can be carried out for reaching specific characteritics of the static magnetic field B0. Particularly the general rule is to minimize differences of strength, direction and homogeneity of the static magnetic field B0 in the three-dimensional model with respect to the strength, direction and homogeneity of the static magnetic field of the two-dimensional model constituting the ideal desired condition.

In practice, the field strength is evaluated at the central point of the cavity and that is at the longitudinal central axis AL of the tubular wall 1. The field homogeneity is measured by defining an ideal surface within the cavity and by measuring the magnetic field strength on said surface.

As an alternative or in combination, in this case the optimization operation is carried out also with reference to individual magnetization vectors of individual magnetized elements forming the tubular structure. Particularly differences of mutual orientations of B vector (magnetic induction) and H vector (magnetic field) are minimized, inside the magnetized material, between the theoretical 2D model and 3D model.

The selected surface can be composed of a sphere centered at the central point of the cavity or said surface can be an ellipsoid.

In this case an ellipsoid centered at the central point of the cavity has been selected. The ellipsoid best suits to the shape of the cavity that in turn is designed for performing examinations on a specific limb and particularly for examinations of the hand.

It has been found advantageous to use a genetic algorithm in order to make the operation determining the best solution more rapid, that is the orientation angle of magnetization vectors J2 of triangular/wedge-shaped elements 101, 201.

The genetic algorithm simulates natural laws of gene combination when generating child individuals from two parent individuals. Nature provides also coupling rules, whereby some individuals are more worthy and facilitated in the coupling process and other ones are not and this with reference to achievement and optimization of child individuals than parent individuals.

Therefore the genetic algorithm by simulating said principles introduces by its nature an optimization path aiming at achieving the best solution. However it is necessary to define the genetic inheritance of individuals and the principle determining the parameter enabling individuals to couple.

There can be several solutions. One of which provides the genetic inheritance to be the direction of the magnetization vector of triangular or wedge-shaped elements, that is the angle with reference to the direction of the magnetic field in the cavity. The numerical coupling enabling parameter can be composed of the peak to peak inhomogeneity parameters of the static magnetic field B0 measured on said ideal surface and/or the strength of the static magnetic field. The methods for combining the genetic inheritance can also be several functions, such as the simple arithmetical means, or other mean functions with different weights.

The fact of applying said genetic algorithm to the problem provides a variation angle of the magnetization vector minimizing differences of homogeneity and strength characteristics of the magnetic field between the two-dimensional model and the three-dimensional model, compensating at a good extent aberrations, distortions and inhomogeneities generated by the extrusion from the two-dimensional model to the three-dimensional model.

In this case as already mentioned above, as an alternative or in combination, the optimization operation is carried out also with reference to the individual magnetization vectors of the individual magnetized elements forming the magnet tubular structure. In particular differences of mutual orientations of B vector (magnetic induction) and H vector (magnetic field) are minimized, within the magnetized material, between the theoretical 2D model and the 3D model.

After all the three-dimensional extension of the magnet leads to changes in the direction of magnetization vectors and of field which are compensated by variation in the starting two-dimensional plane of the angles of magnetization vector direction in the space in the plane perpendicular to the extension axis of the two-dimensional model in the three-dimensional model and not in the direction of the three-dimensional extension axis.

FIG. 5 shows a triangular/wedge-shaped element 201 and variations in the magnetization direction in several points of said element. As already mentioned above, by the fact that the magnet is symmetric the direction variation of the other triangular/wedge-shaped elements can be derived from the one of the present element.

With reference to the shown embodiment, on the basis of such two-dimensional configuration all relevant values of a magnetic structures have been calculated.

The structure has been analyzed by using Tosca program by VectorFields carrying out both linear and non-linear simulations. NdFeB material ($J_r$=1.3706 T) was used as the magnetic material, while for the iron magnetization curves of Fe42 material were used for the yoke and the solid portion of the pole, and of FeSi material for the laminated portion, while the modelling of ARMCO pure iron was used for pole teeth.

Geometrical and magnetic properties of the two-dimensional model of the structure in FIG. 1 are:
maximum opening of the gross cavity X: 22 cm;
gross cavity opening Y: 19 cm;

KAbele=0.25;
B0=3427 gauss;
Amount of magnetic material=1.2 Kg/cm (along 3D direction)
Magnetization orientation J1=90°
(with respect to X-axis)
Magnetization orientation J2=30°
(with respect to X-axis)
Maximum overall dimension in X: 22 cm
(without yoke thickness)
Maximum overall dimensions in Y: 25.4 cm
(without yoke thickness)

A three-dimensional structure model was obtained from the two-dimensional structure model by the extrusion in the Z-axis for 33 cm. Such structure was subjected to two subsequent optimization processes by means of genetic algorithms.

The first optimization process regards the angle of magnetization $J_2$, the second one regards the pole shape with reference particularly to the provision of "teeth" (Filter Structure) which will be described below with reference to FIG. 6.

The yoke has a thickness of 4 cm and it follows the outer shape of the structure, poles are designed according to theoretical equipotential lines of the 2D model and they have well marked trapezoidal section. The fact of introducing poles causes the gross cavity to be reduced to 14 cm.

Table 1 shows the value of the field at the centre and the peak to peak inhomogeneity (evaluated on an ellipsoid with semiaxes of 50×30×70 in XYZ directions) in these two structures without the intervention of the method of the present invention

| Property | Structure | |
| --- | --- | --- |
| | Without poles | With poles |
| B0 (gauss) | 3200 | 2926 |
| inhomogeneity (ppm) | 43000 | 29000 |

The following table II summarizes results obtained after the first optimization process by the genetic algorithm according to the present invention and wherein the orientation of the magnetization $J_2$ was modified for minimizing the peak to peak inhomogeneity on the reference ellipsoid.

| Property | Structure | | |
| --- | --- | --- | --- |
| | Without poles | With poles | With poles and rotation of J2 |
| B0 (gauss) | 3200 | 2926 | 2944 |
| inhomogeneity (ppm) | 43000 | 29000 | 5900 |

Table III shows angle variations of the orientation of the magnetization $J_2$.

| Property | Structure | | Change |
| --- | --- | --- | --- |
| | 2D | 3D J2 rotated | |
| J2 | 30° | 4.7° | −25.3° |

Data of table II show that the change in the orientation of the magnetization J2 leads to a considerable reduction of the peak to peak inhomogeneity (−23100 ppm corresponding approximately to 80% less). Such variation is not converted into a considerable increase of the field value at the centre unlike the "yokeless" case.

The latter structure obtained in this way was subjected to a following optimization process by means genetic algorithm by introducing strips made of ferromagnetic material forming teeth on the pole trying to further reduce the peak to peak inhomogeneity on the reference ellipsoid.

As it is clear in FIG. 6, in order to further improve the homogeneity of the static magnetic field B0 in the cavity of the magnet tubular wall 1 it is possible to provide at open end sides of the structure, that is of said tubular wall 1, elements for filtering or suppressing or reducing distortions and therefore inhomogeneties of the static magnetic field B0 which are due to openings.

As it is known such filters can be composed of projecting elements such as webs, teeth or the like along the edges of poles at the openings. The effect on the static magnetic field B0 depends on the shape and the material of said elements.

According to the present invention, said projections are provided in the form of strips 5, 6 made of ferromagnetic material the amount, shape and size of such strips being determined by an optimization step which provides to further minimize differences between the homogeneity of the static magnetic field B0 in the two-dimensional model and the homogeneity of the static magnetic field B0 in the three-dimensional model.

Also in this case the invention suggests to carry out such optimization by means of a genetic algorithm. In this case the genetic inheritance to be combined of single individuals is composed of the number, size and shape of the ferromagnetic strips, while parameters regarding the inhomogeneity measured on the reference ellipsoid mentioned above are used as the coupling parameter.

The result has provided the combination of two ferromagnetic strips receding with respect to the end border of the pole and one of which is the innermost and the longest one and the outermost one is shorter than said first one and it is centered with respect thereto, while the innermost strip, that is the one arranged more towards the centre of the cavity is narrower and the outermost one is wider than it. The two strips 5, 6 being in contact one to the other by their opposite longitudinal sides. Moreover the outermost strip is thinner than the innermost one.

The following table IV shows magnetic properties of the structure after such change and they are compared with the ones already shown in table II.

| Property structure | Without poles | With poles | With poles J2 rotated | With poles J2 rotated and strips |
| --- | --- | --- | --- | --- |
| B0 (gauss) | 3200 | 2926 | 2944 | 2930 |
| inhomogenity (ppm) | 43000 | 29000 | 5900 | 600 |

As it can be deduced from table IV the introduction of the two ferromagnetic strips resulted in an optimal homogeneity level of the magnetic field.

The following tables show details of all the properties of the final structure obtained in the present feasibility analysis.

| Property | Value |
| --- | --- |
| Field at the centre (gauss) | 2930 |
| Inhomogeneity on ellipsoid 50 × 30 × 70 (ppm) | 600 |

| Direction | Property Gross cavity (cm) |
| --- | --- |
| Along X | 22.0 |
| Along Y | 13.2 |
| Along Z | 33.0 |

| Direction | Property Maximum overall dimensions (cm) |
| --- | --- |
| Along X | 30.0 |
| Along Y | 33.4 |
| Along Z | 33.0 |

| Material | Amount Weight |
| --- | --- |
| Iron in yoke | 80 Kg |
| Iron in pole | 22 Kg |
| NdFeB | 32 Kg |
| Total weight | 134 Kg |

| Property | Dimensions |
| --- | --- |
| Yoke thickness | 4 cm |
| Pole thickness | 3 cm |
| Thickness of solid portion of poles (Y) | 2 cm |
| Thickness of laminated portion of poles (Y) | 1 cm |
| Pole length (X) | 14 cm |
| Position of first tooth (Z) | 12.2 cm |
| Width of first tooth (Z) | 1.4 cm |
| Thickness of first tooth (Y) | 0.4 cm |
| Length of first tooth (X) | 12.8 cm |
| Position of second tooth (Z) | 13.7 cm |
| Width of second tooth (Z) | 2.5 cm |
| Thickness of second tooth (Y) | 0.3 cm |
| Length of second tooth (X) | 10.6 cm |

FIGS. 7 to 14 show a further example of the application of the method according to the present invention and of the magnet obtained by such method.

The starting two-dimensional model is shown in FIG. 7. Even in this case the symmetry is according to the two central axes P1 and P2, perpendicular one to the other and intersecting together the central longitudinal axis AL of the tubular wall 1, one of said axes being perpendicular to the direction of the magnetic field B0 and the other one being parallel to said direction.

In this case the strength target of the static magnetic field B0 is 0.3T.

Geometrical characteristics are as follows:
Width of the cavity in the direction perpendicular to the magnetic field B0 22 cm, height of the cavity in the direction parallel to the static magnetic field 18,50, value K=B/M=0.25.

The structure of the present embodiment is divided into elements in a different way than the one of previous figures and it is more suited to a yokeless structure.

The structure comprises first isosceles, triangular elements 401, 501 which are in contact each other at vertices of their base sides. Two of said first triangular elements 401 are oriented with their base sides perpendicular to the magnetic field B0, and said base sides are faced towards the cavity 2. The other two first triangular elements 501 are oriented with their base sides parallel to the static magnetic field B0. The two pairs of first triangular magnetized elements which are composed of the two elements having the same orientation with respect to the static magnetic field B0 are spaced apart symmetrically with respect to an axis parallel to base sides of said elements which axes intersect the central longitudinal axis of the tubular wall 1.

The first triangular elements 401 perpendicular to the magnetic field B0 have a magnetization whose direction is concordant one to the other and is parallel to the one of the static magnetic field B0 therefore it is perpendicular to base sides of said elements. The two first triangular elements 501 whose bases are parallel to the static magnetic field have a magnetization whose direction is concordant to each other and is antiparallel to the one of the static magnetic field B0 therefore said magnetization is parallel to the base sides thereof.

Said first triangular elements 401, 501 make a first inner wall ring 1 and a second ring of second triangular elements 601, 701 is externally overlapped thereto. Such second triangular elements 601, 701 are in contact each other at each corner where two first triangular elements 401 and 501 contact each other, by an inclined side and together they form an outer corner of the substantially rectangular outer perimeter of the wall according to the two-dimensional model. Each pair of second triangular elements 601, 701 forms one of said corner area and it overlaps by an inclined side the outer inclined side of the corresponding first triangular element 401, 501 its vertice opposite to the side in contact with the other second triangular element ending at the vertice of said corresponding first triangular element 401, 501. Moreover at such location the second triangular element 601, 701 has its vertice coinciding with the one of the further second triangular element 601, 701 forming the further corner area and the latter being the symmetric projection with respect to the central axis P1 or P2 passing through the vertice of said corresponding first triangular element 401, 501.

Pairs of second triangular elements, each one of them forming one of the four corner areas, are symmetric each other according to one of the central axes P1 and P2.

With reference to magnetizations, also these are symmetric with reference to the central axis perpendicular to the direction of the static magnetic field B0 and directions are such that magnetizations of each pair of second triangular elements J2, J3, 601, 701 are perpendicular each other, while magnetization J2 of all the triangular elements in contact with the first triangular elements having the base perpendicular to the magnetic field have a component parallel and concordant to the static magnetic field, while magnetizations J3 of second triangular elements in contact with the first triangular elements 501, whose base is parallel to the static magnetic field B0 have a component antiparallel to said static magnetic field B0.

FIG. 8 shows the three-dimensional model deriving from the extrusion in the Z direction of the two-dimensional model in FIG. 7. Even in this case the two-dimensional triangular elements of FIG. 7 have the same reference numbers as three-dimensional elements, that is of wedges in FIG. 8.

The extrusion of the two-dimensional model produced a three-dimensional model with a static magnetic field with the following characteritics:

| Magnet 3D | |
|---|---|
| Field | 3318 gauss |
| Homogeneity | 60884 ppm |
| Field loss | 3% (−109 G) |

FIG. 9 shows an improvement of the structure of FIGS. 7 and 8 with the introduction of poles 4 and the provision of an outer casing of ferromagnetic material which is not a yoke, but it serves only for defining the potential of external sides of the structure.

The following table show improvements, which are unsatisfactory, introduced by these arrangements:

| 3D magnet with poles and casing | |
|---|---|
| Field | 2900 gauss |
| Homogeneity | 8896 ppm |
| Field loss with respect to 2D model | 16% (−527 G) |
| Homogeneity gain with respect to 3D model without poles and casing | 85% (−51988 ppm) |

By following the same steps of the previous example an optimization process according to the method of the present invention was carried out and even in this case a genetic algorithm was used. Within such optimization the ideal angle relation between B and H in the theoretical two-dimensional model without the outer ferromagnetic casing was considered and wherein B and H are perpendicular into the second triangular elements 601 and 701 having magnetization J2 and J3, while they are parallel in the first triangles 404, 501 having magnetization J4 and J5.

FIG. 10 shows the change in the magnetization orientation of elements 401, 501 forming the right upper corner area of the magnet and the following table shows the characteristics of the three-dimensional model field derived from said optimization:

| 3D magnet with poles and outer casing and with magnetization directions rotated with respect to 2D model | |
|---|---|
| Field | 3185 gauss |
| Homogeneity | 5400 ppm |
| Field loss with respect to 2D model | 7% (−242 G) |
| Homogeneity gain with respect to 3D model with poles and outer casing | 40% (−4596 ppm) |

The angle variation of the direction of magnetizations J2 and J4 into second triangular elements 601 and 701 is shown in the following table:

| Orientation with respect to Y-axis (B0) and angle variation | |
|---|---|
| J2 | 62.1° (+19.4°) |
| J3 | −49.5° (−0.2°) |

As shown in FIG. 11 even in the case of such embodiment the second optimization step provided by the method according to the present invention was carried out and it consists in modelling elements for filtering and/or partially or completely suppressing and/or partially or completely compensating aberrations, distortions and inhomogeneities of the field.

Said filter, suppressing or compensating elements have a structure substantially identical to the one described with reference to the previous embodiment and the fact of modelling them by the genetic algorithm caused the homogeneity of the static magnetic field B0 in the three-dimensional model to be further increased:

| 3D magnet with poles and outer casing and with magnetization directions rotated with respect to 2D model and with filter strips | |
|---|---|
| Field | 3182 gauss |
| Homogeneity | 290 ppm |
| Field loss with respect to 2D model | 7% (−245 G) |
| Homogeneity gain with respect to 3D magnet with poles and outer casing and with magnetization directions rotated with respect to 2D model | 95% (−5110 ppm) |

At the end of the process the obtained magnet shows the following further geometrical and weight characteristics:

| Magnet weight | |
|---|---|
| Fe in casing | 59 Kg |
| Fe in poles | 36 Kg |
| NdFeB | 74 Kg |
| Total weight | 169 Kg |

| Magnet dimensions | |
|---|---|
| Cavity (cm) (width-height-length) | 22 × 13.2 × 33 |
| Total height | 30 cm |
| Total width | 33.4 cm |
| Total length | 33 cm |

FIGS. 12 to 14 show a variant embodiment of the method according to the present invention regarding the first optimization step providing to modify magnetization directions in some of the magnetized elements with respect to the ideal one determined in the two-dimensional model.

Although such improvement is shown with reference to this second embodiment, it can be applied also to the previous embodiment and to any type of three-dimensional permanent magnet to be made.

Moreover for simplicity and clarity reasons only the most simple variant was considered in the example that will be described below in details which provides the magnet to be split in two halves according to a median transverse section plane that is perpendicular to the longitudinal axis of the tubular wall or it provides only or at least said splitting of the second triangular elements 601, 701.

According to such improvement the first optimization step regarding the variation of the magnetization direction of the second triangular elements 601, 701 with respect to the one of the two-dimensional model is carried out individually for each one of the two halves of said second triangular elements denoted by 601, 601' and 701, 701' in FIG. 12. Said two halves are obtained by a splitting action according to said median transverse section plane perpendicular to the longitudinal axis of the tubular wall 1. It is clear that such improvement can also be modified by providing more slices each one split according to a different median transverse section plane perpendicular to the longitudinal axis of the tubular wall, said planes being spaced apart to the same extent or also to a different extent.

Different orientations of the magnetization of the two halves of the triangular element 601 and 701 are shown in FIGS. 13 and 14 respectively and these regard the optimization process being carried out individually for each of said two halves by applying an angle variation to the magnetization direction with respect to the one in the two-dimensional model.

The following table shows magnetization orientations in different slices of triangular elements 601, 701, 601' and 701' compared with the ones of the two-dimensional model:

| Orientations | rotation | 2D model |
| --- | --- | --- |
| Triangle 601 | 85.3° | 42.7° |
| Triangle 601' | 74.3° | 42.7° |
| Triangle 701 | −47.4° | −49.3° |
| Triangle 701' | 0° | −49.3° |

In this case characteristics of the static magnetic field are:

| 3D magnet with magnetizations rotated in two slices and with poles and casing | |
| --- | --- |
| Field | 3500 gauss |
| Homogeneity | 4034 ppm |
| Field gain with respect to 2D model | 7% (+73 G) |
| Homogeneity gain with respect to 3D model with poles and casing and with magnetizations being rotated with no slices | 34% (−1366 ppm) |
| section plane perpendicular to z-axis (longitudinal axis of the tubular wall 1) | 9.9 cm |

The invention claimed is:

1. A permanent magnet particularly for MRI scanners, which magnet has a tubular shape defined by a tube-like three-dimensional wall defining a longitudinal axis and a cross-section with respect to said longitudinal axis and wherein the cross-section has a closed annular shape, the tube-like three-dimensional wall being composed of a plurality of individual elements made of magnetized material having a longitudinal extension parallel to the axis of the tubular shape, said individual elements being arranged one after the other all the adjacent elements made of magnetized material or all of them except for two subsequent elements of magnetized material being provided one in contact to the other along at least a peripheral surface or a linear edge thereof having a longitudinal extension parallel to the axis of the tubular shape;

wherein the magnetization of each said individual element made of magnetized material has a predetermined magnetization direction in a plane perpendicular to the longitudinal axis of the tube-like wall, said magnetization directions being defined so as to generate a uniform static magnetic field having a predetermined strength and a predetermined direction which field passes through a cavity delimited by the tube-like three-dimensional wall, wherein the magnetization direction of at least some individual elements is rotated in said plane perpendicular to the longitudinal axis of the tube-like three-dimensional wall with respect to a theoretical magnetization direction calculated on the basis of a two-dimensional (2D) magnet model corresponding to a cross-section of the tube-like three-dimensional wall of the magnet, while the remaining individual elements keep the theoretical magnetization direction calculated on the basis of said 2D magnet model, and wherein the at least some individual elements are rotated by a predetermined angle calculated such that differences of strength, direction and homogeneity parameters of a static magnetic field generated by a 3D model of the magnet and strength, direction and homogeneity parameters of an ideal static magnetic field according to the 2D magnet model are minimized.

2. Magnet according to claim 1, wherein the difference of mutual orientations of B and H vectors in magnetized materials of the 3D model and of the theoretical 2D model is minimized by changing the magnetization orientation of the material of the 3D model with respect to the theoretical 2D model.

3. Magnet according to claim 1, wherein said plurality of individual elements include at least two first magnetized elements arranged in a position diametrically opposite with respect to the axis of the tubular wall and whose magnetization has the same modulus and concordant direction moreover the magnetization direction being parallel to the direction of the static field passing through the cavity of the tube-like wall, while for the connection of said two first magnetized elements it has magnetized elements having a magnetization whose direction is not parallel to the direction of the static magnetic field into the cavity of the tubular wall, the magnetization direction of only the latter further magnetized elements being modified with respect to the theoretical magnetization direction calculated on the basis of a two-dimensional magnet model corresponding to a cross-section of the magnet tube-like wall.

4. Magnet according to claim 3, wherein the at least two first diametrically opposite magnetized elements have an isosceles trapezium shape, and have the same shape and dimensions, they being arranged with the shortest base side faced towards the shortest base side of the other first magnetized trapezoidal element and with the longest base side faced towards the outside.

5. Magnet according to claim 4, wherein the inclined sides of the two trapezoidal cross-section magnetized elements, which inclined sides are provided at the same side of the central longitudinal axis of said trapezoidal magnetized elements, are connected one to the other by two triangular or irregular trapezium cross-section magnetized elements having a side adhering against the corresponding inclined side of one of the two trapezoidal magnetized elements and are in contact one with the other at a vertice.

6. Magnet according to claim 4, wherein the two triangular or irregular trapezium shaped elements connecting at opposite sides of the central axis of the tube-like wall the inclined sides of the two trapezoidal magnetized elements are symmetric one to the other with respect to a plane parallel to the shortest base surfaces of said two trapezoidal magnetized elements and passing through the central axis of the tube-like wall.

7. Magnet according to claim 6, wherein magnetizations of each pair of triangular or irregular trapezium shaped magnetized elements have magnetization directions inclined symmetrically with respect to said plane parallel to the shortest base surfaces of said two trapezoidal magnetized elements and passing through the central axis of the tube-like wall and have an opposite sense, each one of said magnetization vectors having at least a component parallel to the static field in the cavity.

8. Magnet according to claim 1, wherein said magnet is of the hybrid type or of the yoked type which yoke externally covers like a casing all the outer peripheral shell surface of the tubular wall forming the magnet.

9. Magnet according to claim 8, wherein the tube-like wall is composed of a combination of triangular elements, first isosceles triangular magnetized elements being provided with their bases faced towards the inner cavity of the tube-like wall and forming the shell inner wall thereof of which at least two pairs of triangular elements are diametrically opposite each other with respect to the central axis of the tube-like wall, while bases of said at least two triangular magnetized elements are parallel each other and said first triangular magnetized elements being in contact each other at vertices of the base side, at least two of said first magnetized elements are provided with their base side perpendicular to the direction of the static magnetic field in the cavity and have a magnetization with the same modulus and with concordant direction and a direction concordant to the one of the static magnetic field in the cavity, while at least the further pair of first triangular magnetized elements extends by their base side parallel to the direction of the static magnetic field in the cavity and both of them have a magnetization with the same modulus and a direction opposite to the one of the static magnetic field in the cavity.

10. Magnet according to claim 9, further comprising second triangular magnetized elements each one externally overlapping an inclined side of one of the first triangular magnetized elements and they being mutually in contact each other respectively with a previous second magnetized element by the corresponding inclined sides oriented according to the bisector of the angle formed at the vertice where two first triangular magnetized elements contact each other and, their vertice opposite to said inclined side contacting said previous second magnetized element being in contact with the vertice of a subsequent second magnetized element the assembly of said triangles being symmetric with respect to two central planes parallel to base sides of the two pairs of first triangular magnetized elements respectively.

11. Magnet according to claim 10, wherein the second triangular magnetized elements have magnetizations whose directions are inclined with respect to the direction of the static magnetic field, only the magnetization directions of said second triangular elements being subjected to angle variation with respect to theoretical directions determined on the basis of the two-dimensional magnet model.

12. Magnet according to claim 9, wherein said magnet is yokeless.

13. Magnet according to claim 1, wherein the tube-like wall is split into at least two halves or into several slices according to a median transverse plane or more transverse section planes and angle variations of magnetization directions of the second magnetized elements for minimizing the difference of strength, direction and homogeneity parameters of the static magnetic field generated by the magnet and strength, direction and homogeneity parameters of the ideal static magnetic field according to the two-dimensional model being determined individually for each of the two magnet halves or of the several magnet slices.

14. Magnet according to claim 1, wherein at ends of the tubular wall, at least some of the magnetized elements and preferably said first magnetized elements and at least said first magnetized elements oriented with their cavity interfacing surface perpendicular to the direction of the static magnetic field in said cavity, have elements for filtering distortions of the static magnetic field overlapped to the end band of said cavity interfacing side.

15. Magnet according to claim 14, wherein said filter means are composed of one, two or more strips made of ferromagnetic material.

16. Method for making magnets particularly to be used in MRI scanners, which magnets are three-dimensional and have a tubular wall made of magnetized material, with a longitudinal axis and with a cross-section with respect to said longitudinal axis, which cross-section has a closed or open annular shape, the tube-like wall being composed of a plurality of individual elements made of magnetized material having a longitudinal extension parallel to the axis of the tubular shape, the individual elements being arranged one after the other;

all the adjacent individual elements being made of magnetized material or all of adjacent individual elements except for two subsequent individual elements of magnetized material being provided one in contact to the other along at least a peripheral surface or a linear edge thereof having a longitudinal extension parallel to the axis of the tubular shape;

the magnetization of each individual element made of magnetized material having a predetermined direction in the plane perpendicular to the longitudinal axis of the tubular wall, said directions being defined to generate a uniform static magnetic field having a predetermined direction which field passes through a cavity delimited by the tube-like wall, said method comprising the steps of:

a) determining the modulus and direction of the magnetization vector of the individual elements made of magnetized material by calculating for each magnetized element the modulus and direction of the magnetization vector necessary for generating a static magnetic field having a predetermined strength and a predetermined direction and which field passes through a cavity delimited by the tube-like wall on the basis of a theoretical two-dimensional model of the magnet which corresponds to a cross-section thereof;

b) calculating changes of the static magnetic field into the tube-like wall without modifying magnetization vectors of individual magnetized elements in the condition of the two-dimensional model extended to a three-dimensional model obtained by projecting the two-dimensional model along an axis perpendicular to the said section plane and coinciding with the longitudinal axis of the tubular wall such that said tubular wall in the direction of said axis has a predetermined extension greater than zero and smaller than infinity;

c) modifying the direction of magnetization vectors of at least some of the magnetized elements in the section plane perpendicular to the longitudinal axis of the tube-like wall so as to minimize differences of the characteristics of the static magnetic field determined on the basis of the three-dimensional model with respect to the characteristics obtained on the basis of the two-dimensional model;

d) providing magnetized elements having geometrical shapes corresponding to the ones of the three-dimensional model and having a magnetization with a modulus and direction corresponding to the ones set at step c); and e) assembling the magnet by mounting individual magnetized elements in the relative positions provided by the three-dimensional model.

17. Method according to claim 16, wherein the difference of mutual orientations of B and H vectors into the magnetized materials of 3D model and theoretical 2D model are minimized, by changing the magnetization orientation of the material in the 3D model with respect to the theoretical 2D model.

18. Method according to claim 16, further comprising the magnet tubular structure being split into two, three or more subsequent slices separated according to section planes transverse to the central longitudinal axis of the tube-like wall, steps b) to e) being carried out individually for each magnet slice.

19. Method according to claim 16, wherein the magnet tube-like wall is composed of a combination of elements having a trapezoidal and/or triangular and/or wedge-shaped cross-section, only the magnetization direction of the magnetized elements having a magnetization direction different from the one parallel or antiparallel to the direction of the static magnetic field in the cavity of the tubular wall being subjected to an angle variation with respect to the direction of the two-dimensional model.

20. Method according to claim 16, wherein the value of the magnetization angles with reference to the direction of the static field within the cavity is modified with respect to the theoretical one of the two-dimensional model.

21. Method according to claim 16, wherein the angle variation of the magnetization direction or the variation of the angle with reference to the direction of the magnetic field into the cavity is carried out by genetic algorithm optimization, the genetic inheritance of each individual of the population breeding a generation being characterized by said variation of the magnetization direction and/or of the value of the angle with reference to the direction of the magnetic field within the cavity and the quality evaluation parameter which regulates the coupling among individuals and the combination of genetic characteristics of such individuals being composed of homogeneity and/or strength and/or direction parameters of the static magnetic field thereof.

22. Method according to claim 16, wherein the field value at the centre of the cavity and the peak to peak inhomogeneity on an ideal ellipsoid surface inside the cavity of the tube-like wall are evaluated.

23. Method according to claim 16, further comprising the step of determining structural characteristics of ferromagnetic filter means at the ends of the tube-like wall.

24. Method according to claim 23, wherein filter means are composed of one, two or more strips made of ferromagnetic material having a predetermined position and predetermined dimensions, parameters regarding the amount of strips, the position of strips and dimensions of strips being determined by a genetic algorithm the genetic inheritance of each individual being composed of specific values of parameters regarding the amount of strips, the position of strips and dimensions of strips and coupling enabling parameters being composed of theoretical strength and/or homogeneity values of the static magnetic field.

* * * * *